United States Patent
Horigome et al.

(10) Patent No.: US 11,073,851 B2
(45) Date of Patent: Jul. 27, 2021

(54) MONITORING APPARATUS OF RAW MATERIAL TANK AND MONITORING METHOD OF RAW MATERIAL TANK

(71) Applicant: Tokyo Electron Limited, Tokyo (JP)

(72) Inventors: Kenta Horigome, Iwate (JP); Shinobu Kawamorita, Iwate (JP); Yosuke Matsumoto, Iwate (JP); Kosuke Takahashi, Iwate (JP); Naohide Ito, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 62 days.

(21) Appl. No.: 16/695,411

(22) Filed: Nov. 26, 2019

(65) Prior Publication Data

US 2020/0165720 A1 May 28, 2020

(30) Foreign Application Priority Data

Nov. 28, 2018 (JP) .............................. JP2018-222448

(51) Int. Cl.

| | |
|---|---|
| *G05D 23/19* | (2006.01) |
| *C23C 14/54* | (2006.01) |
| *G05B 15/02* | (2006.01) |
| *C23C 16/44* | (2006.01) |
| *F24F 110/10* | (2018.01) |
| *B01F 15/06* | (2006.01) |

(52) U.S. Cl.
CPC ......... *G05D 23/1951* (2013.01); *C23C 14/54* (2013.01); *C23C 16/4412* (2013.01); *G05B 15/02* (2013.01); *G05D 23/1917* (2013.01); *G05D 23/1931* (2013.01); *G05D 23/1932* (2013.01); *B01F 2015/062* (2013.01); *C03B 2207/81* (2013.01); *F24F 2110/10* (2018.01)

(58) Field of Classification Search
CPC ........... G05D 23/1917; G05D 23/1931; G05D 23/1932; G05D 23/1951; G05B 15/02; F24F 2110/10; C23C 14/54; C23C 16/4412; C03B 2207/81; B01F 2015/062
See application file for complete search history.

(56) References Cited

U.S. PATENT DOCUMENTS

| | | | |
|---|---|---|---|
| 7,199,335 B2 * | 4/2007 | Takami .............. | G03G 15/2042 |
| | | | 219/216 |
| 2014/0262949 A1 * | 9/2014 | Kern ................... | G05D 23/1932 |
| | | | 208/107 |

FOREIGN PATENT DOCUMENTS

| | | | |
|---|---|---|---|
| JP | 2000130975 A | * | 5/2000 |
| JP | 2009-235496 A | | 10/2009 |

* cited by examiner

*Primary Examiner* — Crystal J Barnes-Bullock
(74) *Attorney, Agent, or Firm* — Abelman, Frayne & Schwab

(57) ABSTRACT

A monitoring apparatus for monitoring a raw material tank monitors the temperature of the raw material tank when the temperature of the raw material tank storing a solid or liquid raw material is raised to a set temperature by a heating unit. The monitoring apparatus includes: a temperature determination unit configured to determine whether the temperature has reached a stable range including the set temperature, and determine whether the temperature has deviated from the stable range; and a setting unit configured to set the set temperature of the heating unit to 0° C. when a predetermined timeout time has elapsed from a time point at which the temperature determination unit determined that the temperature deviated from the stable range.

16 Claims, 9 Drawing Sheets

MONITORING APPARATUS OF RAW MATERIAL TANK AND MONITORING METHOD OF RAW MATERIAL TANK

CROSS-REFERENCE TO RELATED APPLICATIONS

This application is based on and claims priority from Japanese Patent Application No. 2018-222448, filed on Nov. 28, 2018 with the Japan Patent Office, the disclosure of which is incorporated herein in its entirety by reference.

TECHNICAL FIELD

The present disclosure relates to a monitoring apparatus and method of a raw material tank.

BACKGROUND

There has been known a raw material gas supply system, in which the inside of a raw material tank, which stores a solid raw material, is heated to sublime the solid raw material and to form a raw material gas, and the raw material gas is introduced into the processing container of a film forming apparatus through a pipe extending from the raw material tank (see, e.g., Japanese Patent Laid-Open Publication No. 2009-235496).

SUMMARY

A monitoring apparatus for monitoring a raw material tank according to an aspect of the present disclosure monitors the temperature of the raw material tank when the temperature of the raw material tank storing a solid or liquid raw material is raised to a set temperature by a heating unit. The monitoring apparatus includes: a temperature determination unit configured to determine whether the temperature has reached a stable range including the set temperature, and determine whether the temperature has deviated from the stable range; and a setting unit configured to set the set temperature of the heating unit to 0° C. when a predetermined timeout time has elapsed from a time point at which the temperature determination unit determined that the temperature deviated from the stable range.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

[Film-Forming Apparatus]

Figure 1:
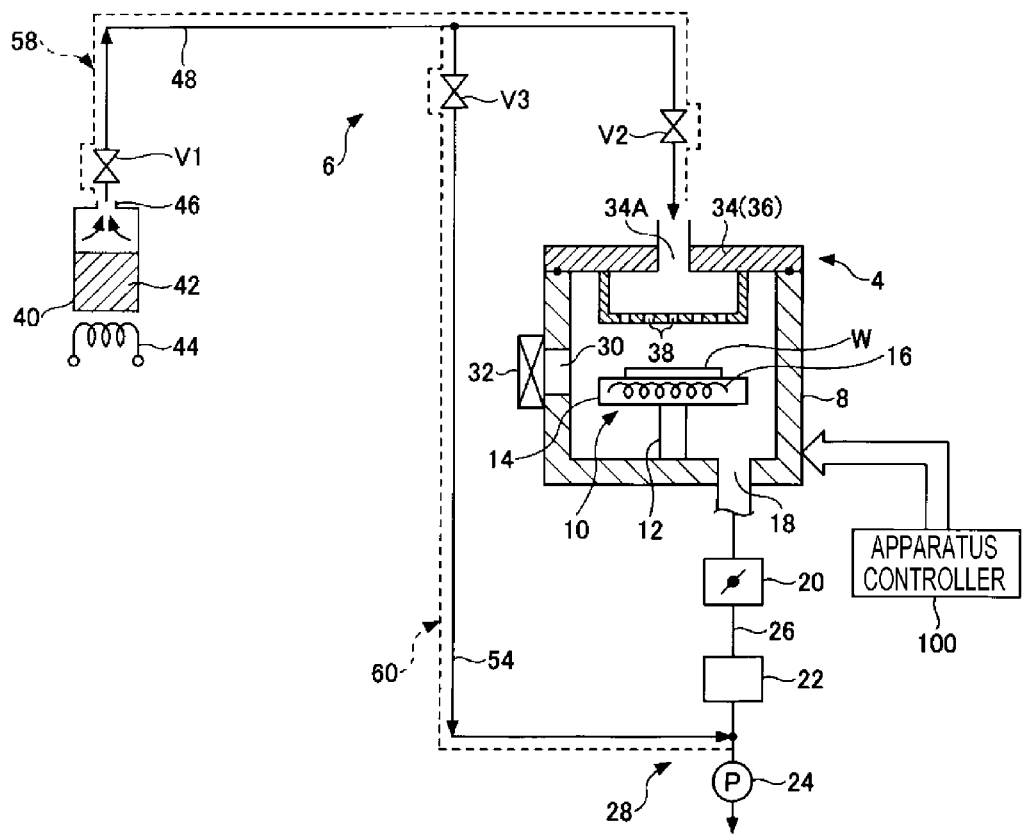
FIG. 1 is a schematic view illustrating an exemplary configuration of a film forming apparatus including a raw material tank.

An exemplary film forming apparatus including a raw material tank is described. FIG. 1 is a schematic view illustrating an exemplary configuration of a film forming apparatus including a raw material tank.

As illustrated in FIG. 1, a film forming apparatus 2 includes a film forming section 4, a source gas supply section 6, and an apparatus controller 100. The film forming section 4 performs a film forming processing on a semiconductor wafer (hereinafter, referred to as "wafer W") as an object to be processed. The raw material gas supply section 6 supplies a raw material gas to the film forming section 4.

The film forming section 4 includes a cylindrical processing container 8 formed of, for example, an aluminum alloy. A holder 10 configured to hold a wafer W is provided in the processing container 8. The holder 10 includes a support column 12 provided at the bottom of the processing container 8 and a disk-shaped stage 14 provided at the upper end of the support column 12. On the stage 14, a wafer W is placed. In the stage 14, a heating unit 16 is provided to heat the wafer W.

An exhaust port 18 is provided at the bottom of the processing container 8. A vacuum exhaust system 28 is connected to the exhaust port 18, in which the vacuum exhaust system 28 has a pressure regulating valve 20, a high-vacuum pump 22, and a rough-vacuum pump 24, which are sequentially disposed therein. The vacuum exhaust system 28 evacuates the inside of the processing container 8 so as to maintain a predetermined reduced pressure atmosphere. For example, a turbo molecular pump may be used as the high-vacuum pump 22. As the rough-vacuum pump 24, for example, a dry pump may be used.

An opening 30 for loading/unloading a wafer W is formed in the side wall of the processing container 8. A gate valve 32 is provided in the opening 30. The gate valve 32 hermetically opens and closes the opening 30.

A gas introduction unit 36 formed by, for example, a shower head 34 is provided on the ceiling of the processing container 8. The gas introduction unit 36 supplies a necessary gas into the processing container 8 through gas ejection holes 38 provided in the lower surface of the shower head 34. A raw material gas is supplied from the raw material gas supply section 6 to a gas inlet 34A of the shower head 34. As the gas introduction unit 36, for example, a nozzle may be used instead of the shower head 34.

The raw material gas supply section 6 includes a raw material tank 40 that stores a raw material 42 that forms a raw material gas. The raw material includes a low-vapor pressure raw material, which has a relatively low vapor pressure and is difficult to evaporate. The raw material may be a solid raw material or a liquid raw material. The raw material tank 40 is provided with tank heating unit 44 configured to heat the raw material 42. When the raw material 42 is heated by the tank heating unit 44, the raw material 42 is vaporized and a raw material gas is generated.

As the tank heating unit 44, for example, a plurality of independently controllable heaters may be used. Hereinafter, when each of the plurality of heaters is distinguished, channel numbers such as, for example, channel 1 (CH1), channel 2 (CH2), . . . , channel n (CHn), may be assigned to respective heaters and described. In addition, a plurality of temperature sensors are provided to correspond to the plurality of heaters, respectively. When distinguishing each of the temperature sensors, the same channel numbers as the heaters corresponding to respective temperature sensors such as, for example, channel 1 (CH1), channel 2 (CH2), . . . , channel n (CHn), may be assigned to respective temperature sensors and described.

A raw material outlet 46 is formed in the ceiling of the raw material tank 40. One end of a raw material passage 48 is connected to the raw material outlet 46. The other end of the raw material passage 48 is connected to the gas inlet 34A of the shower head 34 of the film forming section 4. The raw material passage 48 supplies to the gas inlet 34A the raw material gas formed by vaporizing the raw material 42 in the raw material tank 40.

In the raw material passage 48, an opening/closing valve V1 and an opening/closing valve V2 are provided in this order from the raw material tank 40 side. A rough-vacuum line 54 for exhausting the atmosphere in the raw material passage 48 is branched from the raw material passage 48 between the opening/closing valve V1 and the opening/closing valve V2. The downstream side of the rough-vacuum line 54 is connected between the high-vacuum pump 22 and the rough-vacuum pump 24 in the exhaust passage 26 of the vacuum exhaust system 28. The rough-vacuum line 54 is provided with an opening/closing valve V3.

In addition, a heater 58 is provided in the raw material passage 48. The heater 58 prevents the re-liquefaction or re-solidification of the raw material gas flowing through the raw material passage 48 by heating the raw material passage 48. The heater 58 is provided over the entire area, for example, from the raw material tank 40 to the shower head 34. In addition, the heater 58 is also provided in each of the opening/closing valves V1 to V3 interposed in the middle of the raw material passage 48. As the heater 58, for example, a tape heater, a mantle heater, or a silicon rubber heater may be used when provided in the raw material passage 48, or, for example, an embedded cartridge heater may be when provided in each of the opening/closing valves V1 to V3.

The rough-vacuum line 54 is provided with a heater 60 for the rough-vacuum line. The rough-vacuum line heater 60 prevents the re-liquefaction and re-solidification of the raw material gas flowing through the rough-vacuum line 54 by heating the rough-vacuum line 54.

The apparatus controller 100 controls the overall operation of the film forming apparatus 2 including the film forming section 4 and the raw material gas supply section 6. The apparatus controller 100 controls, for example, start and stop of gas supply by opening and closing operations of the opening/closing valves V1 to V3, instructions for setting temperatures of respective heating units and heaters, process pressure, and process temperature. In addition, the apparatus controller 100 operates as a monitoring apparatus that monitors the temperature of the raw material tank 40. The apparatus controller 100 is, for example, a computer.

[Hardware Configuration of Apparatus Controller]

Figure 2:
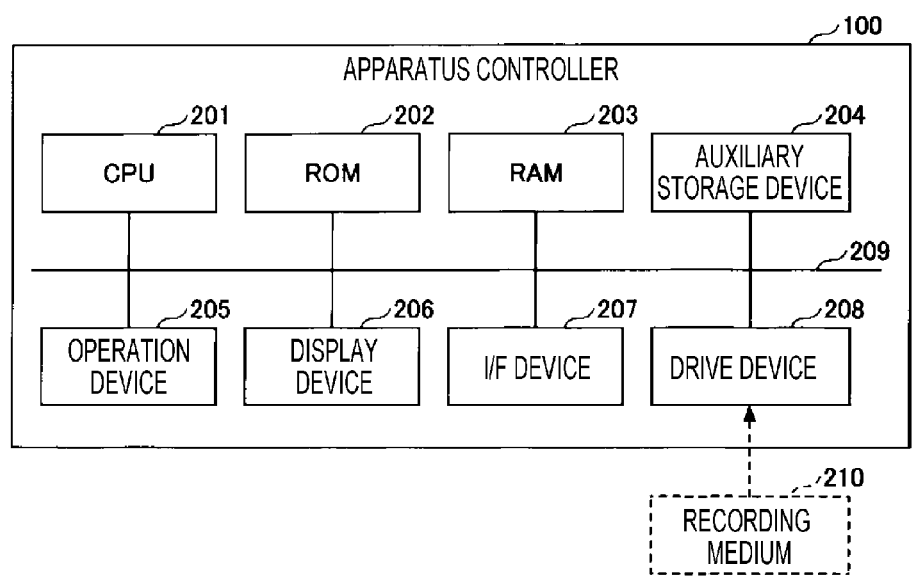
FIG. 2 is a view illustrating an exemplary hardware configuration of an apparatus controller.

Next, a hardware configuration of the apparatus controller 100 will be described. FIG. 2 is a diagram illustrating an exemplary hardware configuration of the apparatus controller 100.

As illustrated in FIG. 2, the apparatus controller 100 includes a central processing unit (CPU) 201, read only memory (ROM) 202, and random access memory (RAM) 203. The CPU 201, the ROM 202, and the RAM 203 form a so-called computer. In addition, the apparatus controller 100 includes an auxiliary storage device 204, an operation device 205, a display device 206, an interface (I/F) device 207, and a drive device 208. In addition, respective hardware components of the apparatus controller 100 are connected to each other via a bus 209.

The CPU 201 executes various programs (e.g., a data analysis program) installed in the auxiliary storage device 204.

The ROM 202 is a nonvolatile memory, and functions as a main storage device. The ROM 202 stores, for example, various programs and data necessary for the CPU 201 to execute the various programs installed in the auxiliary storage device 204. The various programs may include, for example, boot programs such as, for example, a (basic input/output system (BIOS) and an extensible firmware interface (EFI).

The RAM 203 is volatile memory such as, for example, dynamic random-access memory (DRAM) or static random-access memory (SRAM), and functions as a main storage device. The RAM 203 provides a work area to be expanded when the various programs installed in the auxiliary storage device 204 are executed by the CPU 201.

The auxiliary storage device 204 stores various programs and data acquired by executing the various programs by the CPU 201. A storage unit 307 is realized in the auxiliary storage device 204.

The operation device 205 is an input device used by a manager of the apparatus controller 100 to input various instructions to the apparatus controller 100. The display device 206 displays internal information of the apparatus controller 100.

The I/F device 207 is a connection device for connecting to a network 150.

The drive device 208 is a device for inserting a recording medium 210 thereinto. The recording medium 210 includes a medium for optically, electrically or magnetically recording information, such as, for example, a CD-ROM, a flexible disk, or a magneto-optical disk. In addition, the recording medium 210 may include, for example, a semiconductor memory that electrically records information, such as, for example, ROM or flash memory.

In addition, the various programs to be installed in the auxiliary storage device 204 may be installed, for example, by inserting a distributed recording medium 210 into the drive device 208 and reading out the various programs recorded in the recording medium 210 by the drive device 208. Alternatively, the various programs to be installed in the auxiliary storage device 204 may be installed by being downloaded via a network.

[Functional Configuration of Apparatus Controller]

Figure 3:
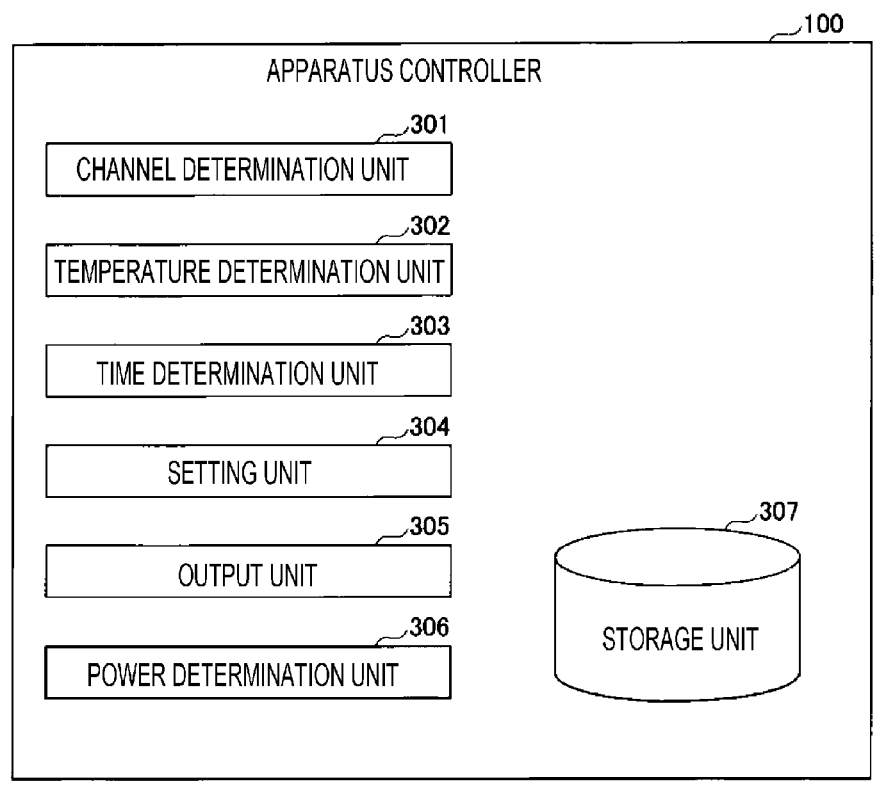
FIG. 3 is a view illustrating an exemplary functional configuration of the apparatus controller.

Next, a hardware configuration of the apparatus controller 100 will be described. FIG. 3 is a view illustrating an exemplary functional configuration of the apparatus controller 100.

As illustrated in FIG. 3, the apparatus controller 100 includes a channel determination unit 301, a temperature determination unit 302, a time determination unit 303, a setting unit 304, an output unit 305, a power determination unit 306, and a storage unit 307.

The channel determination unit 301 executes, for example, channel information acquisition and channel determination. The channel information includes, for example, a channel number, a temperature, and heater power. For example, the channel determination unit 301 acquires channel information, and determines whether the channel is a control target or a monitor target based on the acquired channel information. In addition, the channel determination unit 301 determines whether the channel is a control target based on the acquired channel information. Furthermore, the channel determination unit 301 determines whether the channel is the last channel based on the acquired channel information.

The temperature determination unit 302 executes, for example, temperature acquisition and temperature determination. For example, the temperature determination unit 302 determines whether the temperature included in the channel information acquired by the channel determination unit 301 is within a stable range including the set temperature (within a stable temperature width). In addition, the temperature determination unit 302 determines whether the temperature included in the channel information acquired by the channel determination unit 301 has deviated from the stable range.

The time determination unit 303 executes, for example, time acquisition and time determination. For example, the time determination unit 303 determines whether a monitoring start time has been acquired. In addition, the time determination unit 303 acquires the current time, and calculates a timeout time based on the acquired current time. Furthermore, the time determination unit 303 determines whether the current time is equal to or greater than the timeout time.

The setting unit 304 sets the set temperature of the heater of each channel. For example, when it is determined that the tank heating unit 44 is abnormal, the setting unit 304 sets the set temperatures of the heaters of all the multi-channel channels to 0° C.

The output unit 305 outputs various signals. For example, the output unit 305 outputs a signal that causes the display device 206 to display a warning screen.

The power determination unit 306 executes, for example, heater power acquisition and heater power determination. The power determination unit 306 determines whether the heater power included in the channel information acquired by the channel determination unit 301 is "0%." In addition, the power determination unit 306 determines whether the heater power is equal to or greater than a predetermined value.

The storage unit 307 stores data such as, for example, various times (e.g., a monitoring start time) and various temperatures (e.g., a first temperature and a second temperature to be described later).

[Temperature Deviation Monitoring Process]

Next, as an exemplary monitoring method of the raw material tank 40, a temperature deviation monitoring process executed by the channel determination unit 301, the temperature determination unit 302, the time determination unit 303, the setting unit 304, and the output unit 305 of the apparatus controller 100 will be described.

The temperature deviation monitoring process is a monitoring method for monitoring the temperature of the raw material tank 40 when the temperature of the raw material tank 40 storing a solid or liquid raw material is raised to a set temperature by the tank heating unit 44. In the temperature deviation monitoring process, after the temperature of the raw material tank 40 has reached a stable range, it is determined whether or not the raw material tank 40 has deviated from the stable range, and when a predetermined timeout time has elapsed since it was determined that the temperature of the raw material tank 40 was deviated from the stable range, the set temperature of the tank heating unit 44 is set to 0° C.

Figure 4:
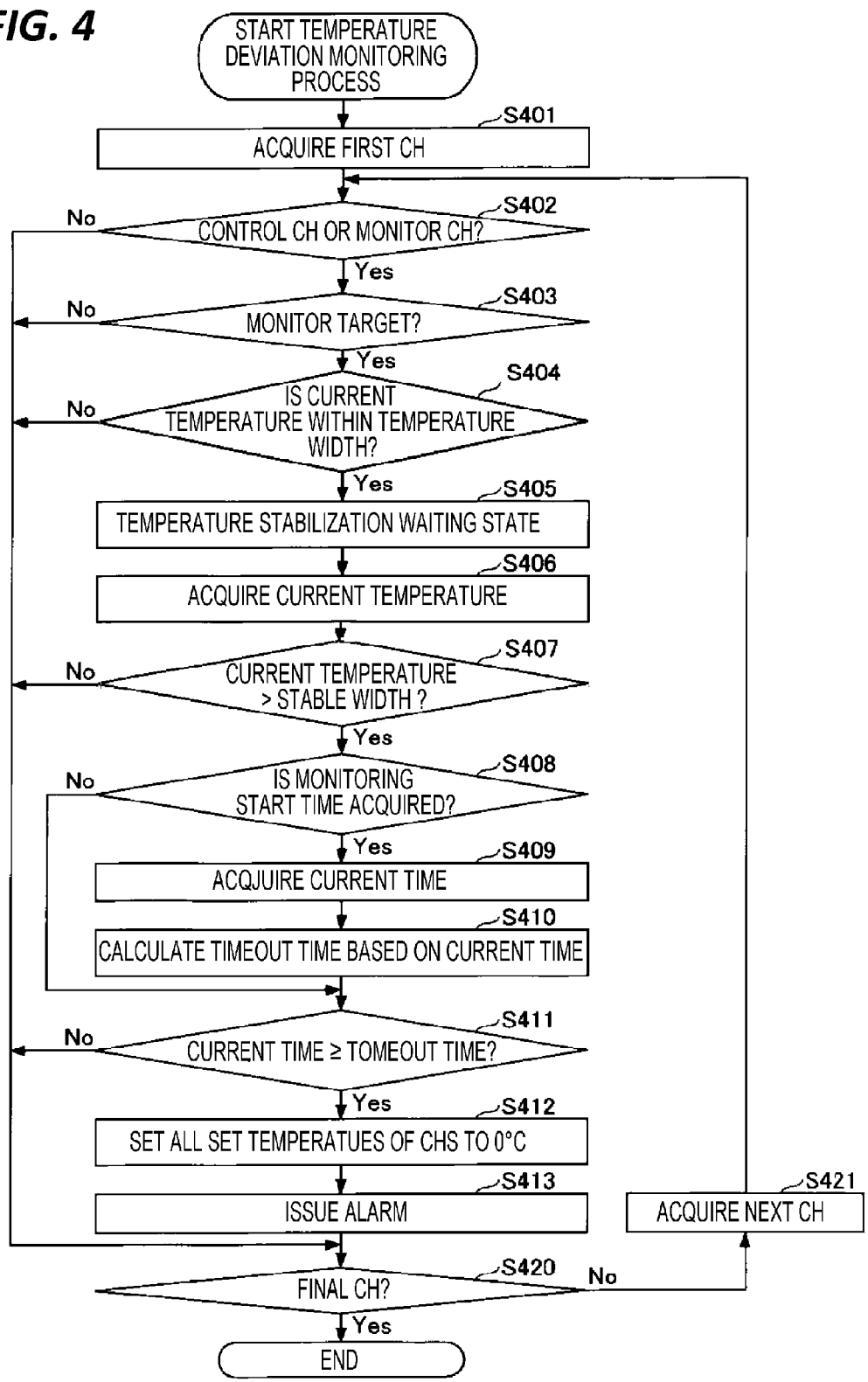
FIG. 4 is a flowchart illustrating an exemplary temperature deviation monitoring process.
Figure 5:
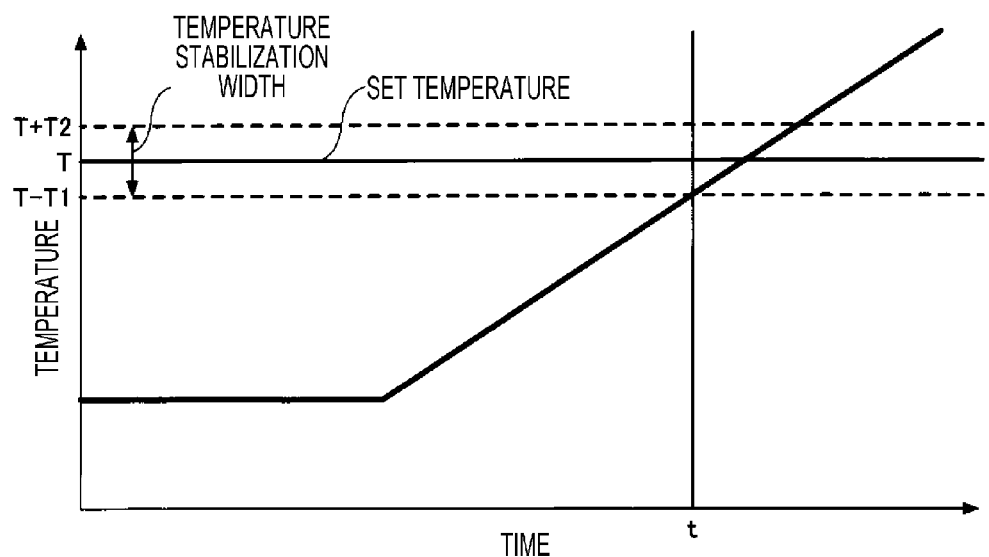
FIG. 5 is a view for explaining a temperature deviation monitoring process.

Hereinafter, a case where the outputs of multi-channel heaters are monitored based on the outputs of multi-channel temperature sensors provided corresponding to respective heaters will be described. FIG. 4 is a flowchart illustrating an exemplary temperature deviation monitoring process. FIG. 5 is a view for explaining a temperature deviation monitoring process.

When the temperature deviation monitoring process illustrated in FIG. 4 is started, the channel determination unit 301 acquires channel information of the first channel (step S401).

Subsequently, the channel determination unit 301 determines whether the current channel is a control target or a monitor target based on the acquired channel information (step S402).

When it is determined that the current channel is not a control target channel and is not a monitor target channel, the channel determination unit 301 advances the process to step S420. Meanwhile, when it is determined that the current channel is a control target channel or a monitor target channel, the channel determination unit 301 determines whether the current channel is a monitor target based on the acquired channel information (step S403).

When it is determined that the current channel is not a monitor target, the channel determination unit 301 advances the process to step S420. Meanwhile, when it is determined that the current channel is not a monitor target, the temperature determination unit 302 determines whether the temperature (the current temperature) included in the channel information acquired by the channel determination unit 301 is within the stable range including the set temperature (within a stable temperature width). In an exemplary embodiment, as illustrated in FIG. 5, the stable temperature width is a temperature of which the lower limit is lower than the set temperature T by a temperature T1 and of which the upper limit is higher than the set temperature T by a temperature T2. The temperature T1 and the temperature T2 may be the same as or different from each other.

When it is determined that the current temperature is not within the stable range including the set temperature, the temperature determination unit 302 advances the process to step S420. Meanwhile, when it is determined that the current temperature is within the stable range including the set temperature, the temperature determination unit 302 determines that the current channel is in a temperature stabilization waiting state, and starts deviation monitoring (time tin FIG. 5) (step S405).

Subsequently, the temperature determination unit 302 acquires the current temperature (step S406). Subsequently, the temperature determination unit 302 determines whether the current temperature acquired in step S406 has deviated from the stable range (step S407).

When it is determined that the current temperature does not deviate from the stable range, the temperature determination unit 302 advances the process to step S420. Meanwhile, when the temperature determination unit 302 determines that the current temperature has deviated from the stable range, the time determination unit 303 determines whether the monitoring start time has been acquired (step S408).

When it is determined that the monitoring start time has not been acquired, the time determination unit 303 advances the process to step S411. Meanwhile, when it is determined that the monitoring start time has been acquired, the time determination unit 303 acquires the current time (step S409).

Subsequently, the time determination unit 303 calculates a timeout time based on the acquired current time (step S410). For example, the timeout time is calculated by subtracting the monitoring start time from the current time (current time−monitoring start time).

Subsequently, the time determination unit 303 determines whether the current time is equal to or greater than the timeout time.

When it is determined that the current time is less than the timeout time, the time determination unit 303 advances the process to step S420. Meanwhile, when it is determined by the time determination unit 303 that the current time is equal to or greater than the timeout time, the setting unit 304 determines that the tank heating unit 44 is abnormal, and sets the set temperatures of all the multi-channel channels to 0° C. (step S412). In addition, the output unit 305 outputs a signal that causes the display device 206 to display a warning screen (step S413). As a result, a warning screen indicating that an alarm has been issued is displayed on the display device 206. The warning screen will be described later. Thereafter, the process proceeds to step S420.

In step S420, the channel determination unit 301 determines whether the channel is the last channel based on the acquired channel information.

When it is determined that the current channel is the last channel, the channel determination unit 301 terminates the process. Meanwhile, when it is determined that the current channel is not the last channel, the channel determination unit 301 acquires channel information of the next channel (step S421), and returns the process to step S402.

According to the temperature deviation monitoring process described above, the apparatus controller 100 determines whether the acquired temperature has reached the stable range including the set temperature, and determines whether the temperature has deviated from the stable range. In addition, the apparatus controller 100 sets the set temperature of the tank heating unit 44 to 0° C. when a predetermined timeout time has elapsed from the time at which it was determined that the acquired temperature deviated from the stable range. Thus, even when the tank heating unit 44 is in an abnormal state (e.g., failure of the tank heating unit 44), it is possible to detect an abnormality.

[Power Monitoring Process]

Next, as an exemplary monitoring method of the raw material tank 40, a power monitoring process executed by the channel determination unit 301, the temperature determination unit 303, the setting unit 304, the output unit 305, the power determination unit 306, and the storage unit 307 of the apparatus controller 100 will be described.

The power monitoring process is a monitoring method for monitoring the temperature of the raw material tank 40 when the temperature of the raw material tank 40 storing a solid or liquid raw material is raised to a set temperature by the tank heating unit 44. In the power monitoring process, an abnormality of the tank heating unit 44 is determined based on the relationship between the temperature change amount of the raw material tank 40 during a predetermined length of time and the output of the tank heating unit 44 during the predetermined length of time. Then, when it is determined that the tank heating unit 44 is abnormal, the set temperature of the tank heating unit 44 is set to 0□.

Figure 6:
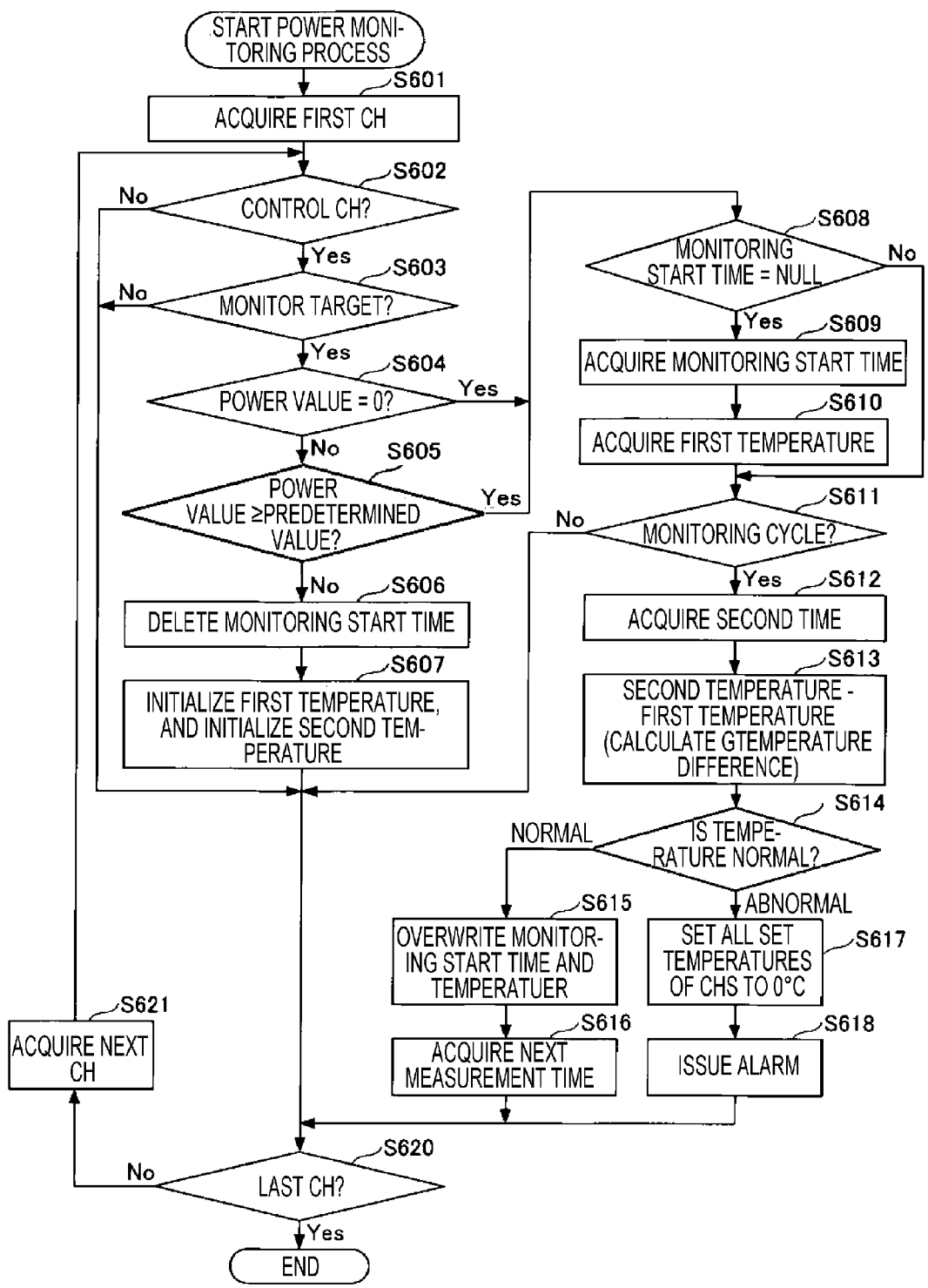
FIG. 6 is a flowchart illustrating an exemplary power monitoring process.
Figure 7:
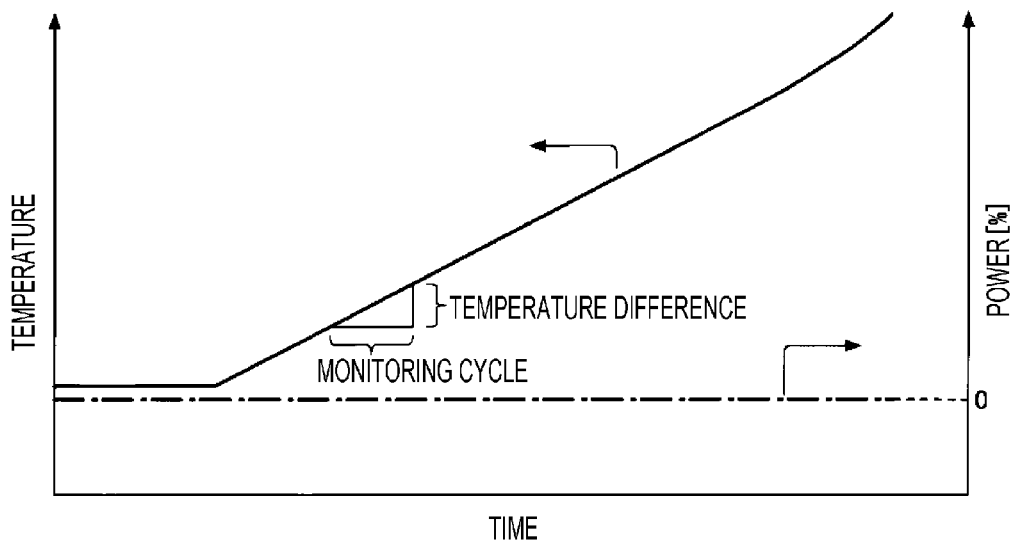
FIG. 7 is a view for explaining a power monitoring process (part 1).
Figure 8:
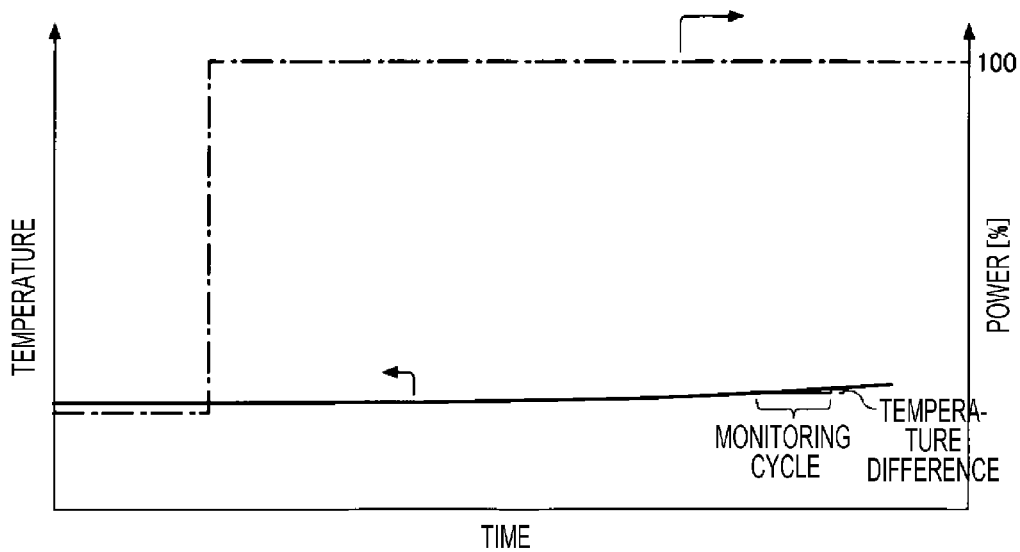
FIG. 8 is a view for explaining a power monitoring process (part 2).

Hereinafter, a description will be made of a case in which the power (output) of a multi-channel heater is monitored based on the output of a multi-channel temperature sensor provided to correspond to each heater of each channel FIG. 6 is a flowchart illustrating an exemplary power monitoring process. FIGS. 7 and 8 are views for explaining the power monitoring process.

When the power monitoring process illustrated in FIG. 6 is started, the channel determination unit 301 acquires channel information of the first channel (step S601).

Subsequently, the channel determination unit 301 determines whether the current channel is a control target based on the acquired channel information (step S602).

When it is determined that the current channel is not a control target, the channel determination unit 301 advances the process to step S620. Meanwhile, when it is determined that the current channel is a control target, the channel determination unit 301 determines whether the current channel is a monitor target based on the acquired channel information (step S603).

When it is determined that the current channel is not a monitor target, the channel determination unit 301 advances the process to step S620. Meanwhile, when it is determined by the channel determination unit 301 that the current channel is a control target, the power determination unit 306 determines whether the heater power included in the channel information acquired by the channel determination unit 301 is "0%" (step S604).

When it is determined that the heater power is "0%," the power determination unit 306 advances the process to step S608. Meanwhile, when it is determined that the power of the heater is not "0%," the power determination unit 306 determines whether the power is equal to or greater than a predetermined value (step S605).

When it is determined that the heater power is equal to or greater than the predetermined value, the power determination unit 306 advances the process to step S608. Meanwhile, when it is determined by the power determination unit 306 that the heater power is less than the predetermined value, the time determination unit 303 deletes the monitoring start time (step S606). In addition, the temperature determination unit 302 initializes the first temperature and the second temperature (step S607). Thereafter, the process proceeds to step S620.

In step S608, the time determination unit 303 determines whether the monitoring start time is stored in the storage unit 307.

When it is determined that the monitoring start time is stored in the storage unit 307, the time determination unit 303 advances the process to step S611. Meanwhile, when it is determined by the time determination unit 303 that the monitoring start time is not stored in the storage unit 307, the time determination unit 303 acquires the current time and stores the same in the storage unit 307 as the monitoring start time (step S609).

Subsequently, the time determination unit 303 acquires the current temperature and stores the same in the storage unit 307 as the first temperature (step S610). Thereafter, the time determination unit 303 advances the process to step S611.

In step S611, the time determination unit 303 acquires the current time, and determines whether a monitoring cycle has been reached based on the monitoring start time stored in the storage unit 307 and the acquired current time. When it is determined that the monitoring period has not been reached, the time determination unit 303 advances the process to step S620. Meanwhile, when it is determined by the time determination unit 303 that the monitoring cycle has been reached, the temperature determination unit 302 acquires the current temperature and stores the same in the storage unit 307 as the second temperature (step S612).

Subsequently, the temperature determination unit 302 calculates a temperature difference obtained by subtracting the first temperature from the second temperature stored in the storage unit 307 (step S613).

Subsequently, the temperature determination unit 302 determines whether the temperature is normal based on the calculated temperature difference and a preset threshold (step S614). Specifically, as illustrated in FIG. 7, in the case in which the heater power of the current channel is "0%," the temperature determination unit 302 determines that the tank heating unit 44 is normal when the temperature difference calculated in step S613 is less than the first threshold. Meanwhile, the temperature determination unit 302 determines that the tank heating unit 44 is abnormal when the temperature difference calculated in step S613 is equal to or greater than the first threshold. In addition, as illustrated in FIG. 8, in the case in which the heater power of the current channel is equal to or greater than a predetermined value, the temperature determination unit 302 determines that the tank heating unit 44 is normal when the temperature difference calculated in step S613 is equal to or greater than the second threshold. Meanwhile, the temperature determination unit 302 determines that the tank heating unit 44 is abnormal when the temperature difference calculated in step S613 is less than the second threshold.

When it is determined that the tank heating unit 44 is normal, the temperature determination unit 302 stores the time at which the first temperature is acquired in the storage unit 307 as the monitoring start time, and the second temperature is overwritten on the first temperature and stored in the storage unit 307. Subsequently, the time determination unit 303 calculates the time at which the next monitoring starts, and stores the same in the storage unit 307 as the monitoring start time (step S616).

Meanwhile, when it is determined by the temperature determination unit 302 that the tank heating unit 44 is abnormal, the setting unit 304 sets the set temperatures of all the multi-channels to 0° C. (step S617). In addition, the output unit 305 outputs a signal that causes the display device 206 to display a warning screen (step S618). As a result, a warning screen indicating that an alarm has been issued is displayed on the display device 206. The warning screen will be described later. Thereafter, the process proceeds to step S620.

In step S620, the channel determination unit 301 determines whether the channel is the last channel based on the acquired channel information. When it is determined that the current channel is the last channel, the channel determination unit 301 terminates the process. Meanwhile, when it is determined that the current channel is not the last channel, the channel determination unit 301 acquires channel information of the next channel (step S621), and returns the process to step S602.

According to the power monitoring process described above, the apparatus controller 100 determines an abnormality of the tank heating unit 44 based on the relationship between the temperature change amount of the raw material tank 40 during a predetermined length of time and the output of the tank heating unit 44 during the predetermined length of time. When it is determined that the tank heating unit 44 is abnormal, the set temperature of the tank heating unit 44 is set to 0□. Therefore, the abnormality of the tank heating unit 44 may be detected by a physical factor, such as, for example, incorrect insertion or non-connection between the plurality of heaters of the tank heating unit 44. Thus, the abnormality of the tank heating means 44 caused by an artificial mistake may be detected.

[Warning Screen]

Next, an exemplary warning screen displayed on the display device 206 will be described.

Figure 9:
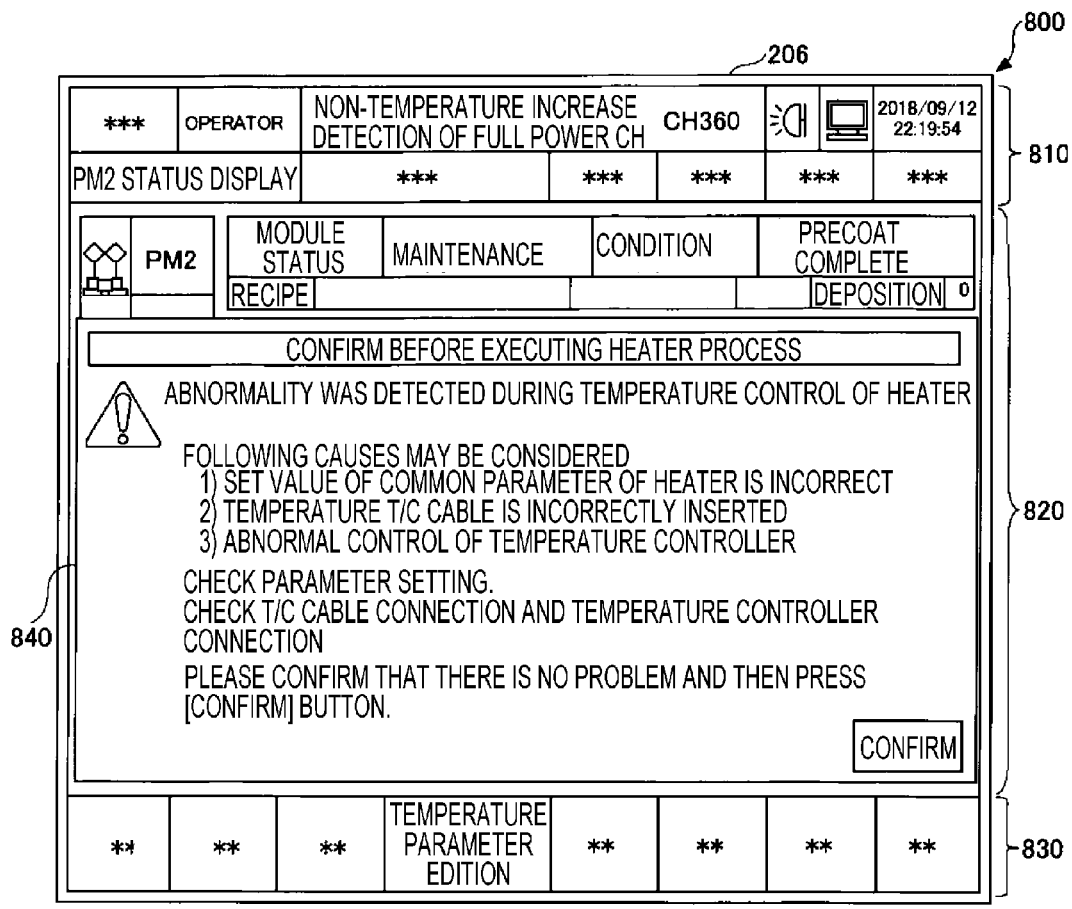
FIG. 9 is a view illustrating an exemplary warning screen displayed when an abnormality is detected.

FIG. 9 is a view illustrating an exemplary warning screen displayed when an abnormality is detected. As illustrated in FIG. 9, the warning screen 800 includes a status display portion 810, a detailed display portion 820, a menu display portion 830, and a warning display portion 840.

The status display portion 810 displays the status of the entire system including the film forming apparatus 2, for example, the operation modes (e.g., an administrator mode and an operator mode), a selected apparatus, an alarm content, and the current time. In the example illustrated in FIG. 9, the status display portion 810 displays "OPERATOR" indicating that the operator mode is selected, as the operation mode. In addition, the status display portion 810 displays "PM2 STATUS DISPLAY" indicating that the second process module is selected, as the selected apparatus. In addition, the status display portion 810 displays, as the alarm content, "NON-TEMPERATURE INCREASE OF CH360 OF FULL POWER CH" indicating that although the heater output of the CH360 is full power (100%), heating is not performed. Furthermore, the status display portion 810 displays "2018/09/12 22:19:54" indicating Sep. 12, 2018, 22:19:54, as the current time.

The detailed display portion 820 displays detailed information of a module displayed by the status display portion 810 as a selected apparatus (e.g., a process module, a transport module, a load-lock module, or a loader module). The detailed information may be, for example, a module status (e.g., automatic, manual, or maintenance), a condition (e.g., pre-coating completion or film-forming completion), a recipe, or the number of times of film formation (deposition) (e.g., 0 times, 1 time, or 2 times).

The menu display portion 830 displays various menu buttons that are operable by an operator such as, for example, an administrator or an operator. The menu buttons may include, for example, a "TEMPERATURE PARAMETER EDITION" button for changing the setting of the temperature parameter.

The warning display portion 840 is displayed superimposed on the detailed display portion 820 when an abnormality of the tank heating unit 44 is detected in the temperature deviation monitoring process or the power monitoring process executed by the apparatus controller 100. The warning display portion 840 displays, for example, the fact that an abnormality has been detected during temperature control of the raw material tank 40, an estimated cause of the abnormality, and a recovery method. In addition, the warning display portion 840 has a "CONFIRM" button that is an operation area for accepting an operation, and invalidates a change in setting related to the operation of the tank heating unit 44 in the state in which the "CONFIRM" button is not operated.

In the example illustrated in FIG. 9, the warning display portion 840 displays "ABNORMALITY WAS DETECTED DURING HEATER TEMPERATURE CONTROL" as information indicating that an abnormality was detected during temperature control of the raw material tank 40. In addition, the warning display portion 840 displays information indicating the causes of the estimated abnormality as follows: "THE FOLLOWING CAUSES MAY BE CONSIDERED. 1) SET VALUE OF COMMON PARAMETER OF HEATER T/C IS INCORRECT. 2) TEMPERATURE T/C CABLE IS INCORRECTLY INSERTED. 3) ABNORMAL CONTROL OF TEMPERATURE CONTROLLER." In addition, the warning display portion 840 provides information indicating the recovery method, "CHECK SET VALUE OF PARAMETER. CHECK TEMPERATURE T/C CABLE CONNECTION AND TEMPERATURE CONTROLLER CONNECTION. PLEASE CONFIRM THAT THERE IS NO PROBLEM AND THEN PRESS [CONFIRM] BUTTON."

Figure 10:
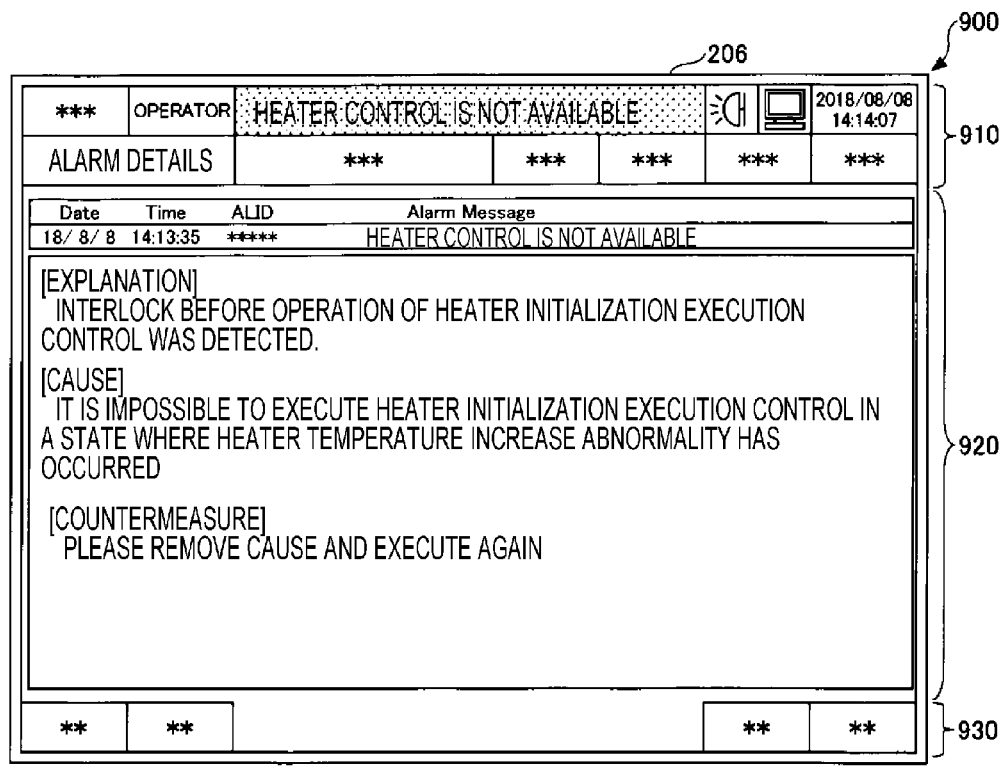
FIG. 10 is a view illustrating another exemplary warning screen displayed when an abnormality is detected.

FIG. 10 is a view illustrating another exemplary warning screen displayed when an abnormality is detected. The warning screen illustrated in FIG. 10 is displayed when an operation of changing the setting of the heater operation is performed by an operator in the state in which the "CONFIRM" button displayed on the warning display portion 840 of the warning screen 800 illustrated in FIG. 9 is not operated.

As illustrated in FIG. 10, a warning screen 900 includes a status display portion 910, a detailed display portion 920, and a menu display portion 930.

The status display portion 910 displays the status of the entire system including the film forming apparatus 2, for example, the operation modes (e.g., an administrator mode and an operator mode), a selected apparatus, an alarm content, and the current time.

In the example illustrated in FIG. 10, the status display portion 910 displays "OPERATOR" indicating that the operator mode is selected as the operation mode. In addition, the status display portion 910 displays "ALARM DETAILS" indicating that an alarm has occurred, as information indicating the selected apparatus. In addition, the status display portion 910 displays "HEATER CONTROL IS NOT AVAILABLE" indicating that it is impossible to control the heater, as the alarm content. The alarm content is highlighted so that, for example, the operator is capable of easily recognizing the same. Further, the status display portion 910 displays "2018/08/08 14:14:07" indicating Aug. 8, 2018, 14:14:07, as information indicating the current time.

The detailed display portion 920 displays detailed information of the alarm, for example, an outline of the alarm, a notification that the heater control has failed, a cause, and a recovery method. In the example illustrated in FIG. 10, the detailed display portion 920 displays the date (DATE), time (TIME), alarm ID (ALID), and alarm message (ALARM MESSAGE) when the alarm occurred as an overview of the alarm. In addition, the detailed display portion 920 displays "[EXPLANATION] INTERLOCK BEFORE OPERATION OF HEATER INITIALIZATION EXECUTION CONTROL HAS BEEN DETECTED," as a notification that heater control has failed. In addition, the detailed display portion 920 displays "[CAUSE] IT IS IMPOSSIBLE TO EXECUTE HEATER INITIALIZATION EXECUTION CONTROL IN STATE IN WHICH HEATER TEMPERATURE INCREASE ABNORMALITHY HAS OCCURRED," as a cause. Furthermore, the detailed display portion 920 displays "[COUNTERMEASURE] PLEASE REMOVE CAUSE AND EXECUTE AGAIN," as a recovery method.

According to the present disclosure, it is possible to detect an abnormality of a heater that heats a raw material tank.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A monitoring apparatus comprising:
a memory; and
a processor coupled to the memory and configured to:
when a temperature of a raw material tank storing a solid or liquid raw material is raised to a set temperature by a heater, determine whether the temperature of the raw material tank has reached a stable range including the set temperature, and determine whether the temperature of the raw material tank has deviated from the stable range; and
set the set temperature of the heater to 0° C. when a predetermined timeout time has elapsed from a time point at which the temperature of the raw material tank is determined to be deviated from the stable range.

2. The monitoring apparatus according to claim 1, wherein the processor is further configured to output a signal for causing a warning screen to be displayed when the predetermined timeout time has elapsed from a time point at which the temperature of the raw material tank is determined to be deviated from the stable range.

3. The monitoring apparatus according to claim 2, wherein the warning screen has an operation area for receiving an operation, and a change of setting related to an operation of the heater is invalidated in a state where the operation area is not operated.

4. The monitoring apparatus according to claim 3, wherein, when the setting related to the operation of the heater is performed without operating the operation area, the processor outputs a signal to display a warning screen indicating that the change of the setting is invalidated.

5. The monitoring apparatus according to claim 1, wherein the heater includes a plurality of sub-heaters that are independently controllable, and
the processor sets the set temperature to 0☐ with respect to all the sub-heaters of the heater.

6. A monitoring apparatus comprising:
a memory; and
a processor coupled to the memory and configured to:
when a temperature of a raw material tank storing a solid or liquid raw material is raised to a set temperature by a heater, determine an abnormality of the heater based on a relationship between a temperature change amount of the raw material tank at a predetermined time and an output of the heater at the predetermined time; and
set the set temperature of the heater to 0° C. when determined that the heater is abnormal.

7. The monitoring apparatus according to claim 6, wherein the processor determines that the heater is abnormal when the output of the heater at the predetermined time is 0% and the temperature change amount of the raw material tank at the predetermined time is equal to or greater than a first threshold.

8. The monitoring apparatus according to claim 7, wherein the processors determines that the heater is abnormal when the output of the heater at the predetermined time is equal to or greater than a predetermined value and the temperature change amount of the raw material tank at the predetermined time is less than a second threshold.

9. The monitoring apparatus according to claim 8, wherein the processor is further configured to output a signal for causing a warning screen to be displayed when determined that the heater is abnormal.

10. The monitoring apparatus according to claim 9, wherein the warning screen has an operation area for receiving an operation, and a change of setting related to an operation of the heater is invalidated in a state where the operation area is not operated.

11. The monitoring apparatus according to claim 10, wherein, when the setting related to the operation of the heater is performed without operating the operation area, the processor outputs a signal to display a warning screen indicating that the change of the setting is invalidated.

12. The monitoring apparatus according to claim 11, wherein the heater includes a plurality of sub-heaters that are independently controllable, and the processor sets the set temperature to 0☐ with respect to all the sub-heaters of the heater.

13. The monitoring apparatus according to claim 6, wherein the processor determines that the heater is abnormal when the output of the heater at the predetermined time is equal to or greater than a predetermined value and the temperature change amount of the raw material tank at the predetermined time is less than a second threshold.

14. The monitoring apparatus according to claim 6, wherein the processor is further configured to output a signal for causing a warning screen to be displayed when determined that the heater is abnormal.

15. A monitoring method comprising:

when a temperature of a raw material tank storing a solid or liquid raw material is raised to a set temperature by a heater, determining whether the temperature of the raw material tank has reached a stable range including the set temperature;

determining whether the temperature has deviated from the stable range including the set temperature; and setting the set temperature of the heater to 0° C. when a predetermined timeout time has elapsed from a time point at which the temperature of the raw material tank is determined to be deviated from the stable range.

16. A monitoring method comprising:

when a temperature of a raw material tank storing a solid or liquid raw material is raised to a set temperature by a heater, determining an abnormality of the heater based on a relationship between a temperature change amount of the raw material tank at a predetermined time and an output of the heating unit at the predetermined time; and setting the set temperature of the heater to 0° C. when determined that the heater is abnormal.

* * * * *